United States Patent
Jung et al.

(10) Patent No.: US 11,088,233 B2
(45) Date of Patent: Aug. 10, 2021

(54) DISPLAY DEVICE

(71) Applicant: Samsung Display Co., Ltd., Yongin-si (KR)

(72) Inventors: Youngtaeg Jung, Yongin-si (KR);
Wonkyu Kwak, Yongin-si (KR);
Wonmi Hwang, Yongin-si (KR);
Jaewon Cho, Yongin-si (KR); Geurim Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 134 days.

(21) Appl. No.: 16/583,847

(22) Filed: Sep. 26, 2019

(65) Prior Publication Data
US 2020/0266255 A1 Aug. 20, 2020

(30) Foreign Application Priority Data

Feb. 18, 2019 (KR) .................. 10-2019-0018817

(51) Int. Cl.
*H01L 27/32* (2006.01)

(52) U.S. Cl.
CPC ...... *H01L 27/3258* (2013.01); *H01L 27/3248* (2013.01); *H01L 27/3276* (2013.01)

(58) Field of Classification Search
CPC ............... H01L 27/323; H01L 27/3248; H01L 27/3258; H01L 27/3276
USPC .......................................................... 257/79
See application file for complete search history.

(56) References Cited

U.S. PATENT DOCUMENTS

| | | |
|---|---|---|
| 8,536,580 B2 | 9/2013 | Kang |
| 9,991,462 B2 | 6/2018 | Park et al. |
| 2009/0261337 A1* | 10/2009 | Sakakura ............ H01L 27/283 257/72 |
| 2017/0278912 A1 | 9/2017 | Kim et al. |
| 2018/0033998 A1 | 2/2018 | Kim et al. |
| 2018/0122890 A1 | 5/2018 | Park et al. |
| 2018/0197974 A1* | 7/2018 | Takamaru ............ H01L 21/467 |
| 2019/0006442 A1 | 1/2019 | Byun et al. |

FOREIGN PATENT DOCUMENTS

| | | |
|---|---|---|
| KR | 10-2017-0113763 | 10/2017 |
| KR | 10-1811027 | 12/2017 |
| KR | 10-2018-0013452 | 2/2018 |
| KR | 10-2018-0025104 | 3/2018 |
| KR | 10-2018-0047536 | 5/2018 |
| KR | 10-2018-0060311 | 6/2018 |

* cited by examiner

*Primary Examiner* — Long K Tran
(74) *Attorney, Agent, or Firm* — Kile Park Reed & Houtteman PLLC

(57) ABSTRACT

A display device includes hole patterns of upper and lower conductive layers that are disposed in a peripheral area of the display device and are asymmetric with respect to an opening of an insulating layer of the display device. A first one of the hole patterns may coincide with a second one of the hole patterns in a part of the peripheral area, while the first one of the hole patterns may cross the second one of the hole patterns in another part of the peripheral area.

24 Claims, 16 Drawing Sheets

DISPLAY DEVICE

CROSS-REFERENCE TO RELATED APPLICATION

This application claims the benefit of Korean Patent Application No. 10-2019-0018817 under 35 U.S.C. § 119, filed on Feb. 18, 2019, in the Korean Intellectual Property Office, the disclosure of which is incorporated herein in its entirety by reference.

BACKGROUND

1. Technical Field

The disclosure relates generally to a display device, and more specifically, to a configuration therefor that prevents and reduces deterioration of a quality of a display image caused by the introduction of impurities and electrical interference within an area adjacent to a display area of the display device.

2. Description of the Related Art

Recently, a variety of types of display devices have been developed which have minimized thicknesses, and thus, weight. As a result, many different types of uses for such display devices exist and continue to evolve. Some of these display devices include foldable display devices or rollable display devices, in addition to flat panel display devices.

In these and other types of display devices, it is desirable to avoid the deterioration of the quality of a display image since an ability to interpret the image is fundamental to a desired use of the particular display device.

SUMMARY

Embodiments relate to a display device that prevents and reduces deterioration of a quality of a display image caused by the introduction of impurities and electrical interference within an area adjacent to a display area of the display device.

According to an embodiment, a display device includes: a substrate including a display area and a peripheral area surrounding a periphery of the display area, the peripheral area including a first peripheral area and a second peripheral area; an insulating layer including a first insulating layer and a second insulating layer each disposed in the display area, the first peripheral area and the second peripheral area, and a first opening penetrating the first insulating layer and the second insulating layer between the first peripheral area and the second peripheral area; a first conductive layer including a first hole disposed in the first peripheral area and a second hole disposed in the second peripheral area; and a second conductive layer disposed on the first conductive layer, and including a third hole disposed in the first peripheral area and a fourth hole disposed in the second peripheral area, wherein a portion of the of the first hole and a portion of the third hole overlap each other, and the second hole and the fourth hole are offset from one another.

The first conductive layer may be disposed on the first insulating layer, and the second conductive layer may be disposed on the second insulating layer.

The second conductive layer may be disposed over the first opening.

The display device may further include a first electrode disposed in the display area and on the second insulating layer, an emission layer on the first electrode, and a second electrode facing the first electrode.

The display device may further include a third insulating layer disposed on the second insulating layer, and including a second opening through which a portion of the first electrode is exposed and a third opening through which a portion of the second conductive layer is exposed.

The second electrode may contact the second conductive layer in the third opening.

The third insulating layer may further include a fourth opening in which the first opening is disposed.

The second conductive layer and the first electrode may be disposed on a same layer.

The second electrode may be disposed over a portion of the second peripheral area.

The display device may further include a contact part that contacts the first conductive layer and the second conductive layer.

The display device may further include a first signal line disposed between the substrate and the first conductive layer in the second peripheral area, and a second signal line disposed on the second conductive layer in the second peripheral area.

Varying voltages may be applied to the first signal line and the second signal line.

The display device may further include an encapsulation layer disposed between the second signal line and the second conductive layer.

The display device may further include a power line disposed in the second peripheral area on a same layer as the first signal line, the power line contacting edges of the first conductive layer.

The display device may further include a driving circuit disposed in the first peripheral area and under the first conductive layer.

The first hole and the third hole may overlap to coincide and face each other.

The second hole and the fourth hole are offset to be spatially opposed in positioning and sequence.

According to an embodiment, a display device includes: a substrate including a display area and a peripheral area surrounding a periphery of the display area; a first insulating layer disposed on the substrate; a second insulating layer disposed on the first insulating layer, each of the first insulating layer and the second insulating layer being disposed in the display area and the peripheral area; a first opening penetrating the first insulating area and the second insulating area in the peripheral area; a first conductive layer disposed on the first insulating layer and having a first hole pattern; and a second conductive layer disposed on the second insulating layer and having a second hole pattern, wherein the first hole pattern and the second hole pattern coincide with each other in an area between the display area and a first opening, and the first hole pattern and the second hole pattern cross each other in an area between the first opening and edges of the substrate.

The display device may further include: a first electrode disposed on the second insulating layer; a third insulating layer disposed on the second insulating layer and including a second opening through which a portion of the first electrode is exposed and a third opening through which a portion of the second conductive layer is exposed; an emission layer disposed on the second opening; and a second electrode facing the first electrode.

The second electrode may contact the second conductive layer in the third opening.

The second conductive layer and the first electrode may be disposed on a same layer.

The display device may further include a contact part that contacts the first conductive layer and the second conductive layer.

The first hole pattern and the second hole pattern may coincide to face each other in the area between the display area and the first opening.

The first hole pattern and the second hole pattern may cross each other to be spatially opposed in positioning and sequence in the area between the first opening and the edges of the substrate.

BRIEF DESCRIPTION OF THE DRAWINGS

These and/or other aspects will become apparent and more readily appreciated from the following description of the embodiments, when taken in conjunction with the accompanying drawings, in which.

DETAILED DESCRIPTION

Figure 1:
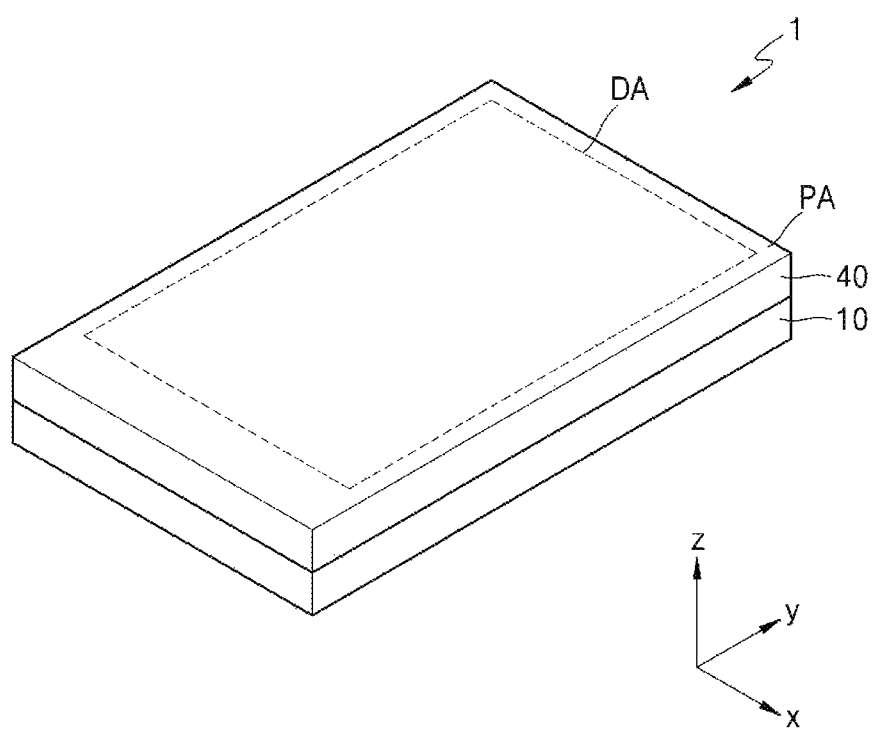
FIG. 1 is a perspective view schematically illustrating a display device according to an embodiment.

As used herein, the term "and/or" includes any and all combinations of one or more of the associated listed items. Expressions such as "at least one of," when preceding a list of elements, modify the entire list of elements and do not modify the individual elements of the list.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

The drawings and description are to be regarded as only illustrative in nature, and thus are not limiting of embodiments described and claimed herein. Some of the parts which are not associated with the description may not be provided in order to describe embodiments of the disclosure and like reference numerals refer to like elements throughout the specification.

In the drawings, a size and thickness of each element are arbitrarily represented for better understanding and ease of description, however the disclosure is not limited thereto. In the drawings, the thickness of layers, films, panels, regions, and other elements may be exaggerated for clarity. In the drawings, for better understanding and ease of description, the thicknesses of some layers and areas may be exaggerated.

In the specification, the term "and/or" includes any and all combinations of one or more of the associated listed items. Expressions such as "at least one of" when preceding a list of elements, modify the entire list of elements and do not modify the individual elements of the list. As used herein, the singular forms "a," "an" and "the" are intended to include the plural forms as well, unless the context clearly indicates otherwise.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" means that a first object may be above or below a second object, and vice versa. When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a perspective view schematically illustrating a display device according to an embodiment.

Referring to FIG. 1, a display device 1 includes a display area DA in which light is emitted, and a peripheral area PA, which surrounds a periphery of the display area DA. The peripheral area PA is a non-display area in which no light is emitted. The display device 1 may provide a certain image according to lights emitted from pixels arranged in the display area DA.

Hereinafter, an organic light-emitting display device will be described as the display device 1 according to an embodiment. However, a display device according to an embodiment is not limited thereto. In another embodiment, a variety of display devices, such as an inorganic light-emitting display device, an inorganic electroluminescence (EL) display device, and a quantum dot light-emitting display device, may be used. The display device 1 according to an embodiment may be a flexible display device, such as a flat panel display device, a foldable display device, or a rollable display device.

The display device 1 may include a display panel 10 and an input-sensing layer 40 positioned on the display panel 10. The display device 1 may be one of a variety of electronic devices, such as a mobile phone, a laptop computer, and a smart watch, or other smart device.

The display panel 10 may display an image. The display panel 10 includes pixels arranged in the display area DA. The pixels may include a display element and a pixel circuit connected to the display element. The display element may include an organic light-emitting diode, an inorganic light-emitting diode, or a quantum dot light-emitting diode, and the like.

The input-sensing layer 40 acquires coordinate information according to an external input, for example, a touch event. The input-sensing layer 40 may include a sensing electrode (or a touch electrode) and sensing signal lines connected to the sensing electrode (or the touch electrode). The input-sensing layer 40 may be positioned on the display panel 10.

The input-sensing layer 40 may be formed directly on the display panel 10 or may be formed separately from the display panel 10 and then coupled to the display panel 10 via an adhesion layer, such as an optical clear adhesive (OCA). For example, the input-sensing layer 40 may be continuously formed after a process of forming the display panel 10. Thus, the adhesion layer may not be between the input-sensing layer 40 and the display panel 10.

Although not shown, an optical functional layer and a window may be sequentially positioned on the input-sensing layer 40. In another embodiment, the input-sensing layer 40 may be positioned on the optical functional layer.

The optical functional layer may include an anti-reflection layer. The anti-reflection layer may reduce reflectivity of light (external light) incident toward the display panel 10 from an outside via a window. The anti-reflection layer may include a retarder and a polarizer. The retarder may be of a film type or liquid crystal coating type and may include a λ/2 retarder and/or a λ/4 retarder. The polarizer may also be of a film type or liquid crystal coating type. The film type may include an elongation type synthetic resin film, and the liquid crystal coating type may include liquid crystals arranged in a certain arrangement. The retarder and the polarizer may further include a protective film. The retarder and the polarizer themselves or the protective film may be defined as a base layer of the anti-reflection layer.

In another embodiment, the anti-reflection layer may include a black matrix and color filters. The color filters may be arranged in consideration of a color of light emitted from each of the pixels of the display panel 10. In another embodiment, the anti-reflection layer may include a destructive interference structure. The destructive interference structure may include a first reflection layer and a second reflection layer, which are arranged on different layers. First reflected light and second reflected light, which are reflected from the first reflection layer and the second reflection light, respectively, may be destructively interfered. Thus, the reflectivity of external light may be reduced.

The optical functional layer may include a lens layer. The lens layer may improve emission efficiency of light emitted from the display panel 10 or may reduce color deviation. The lens layer may include a layer having a concave or convex lens shape and/or a plurality of layers having different refractive indexes. The optical functional layer may include the above-described anti-reflection layer and lens layer or any one thereof.

Figure 2:
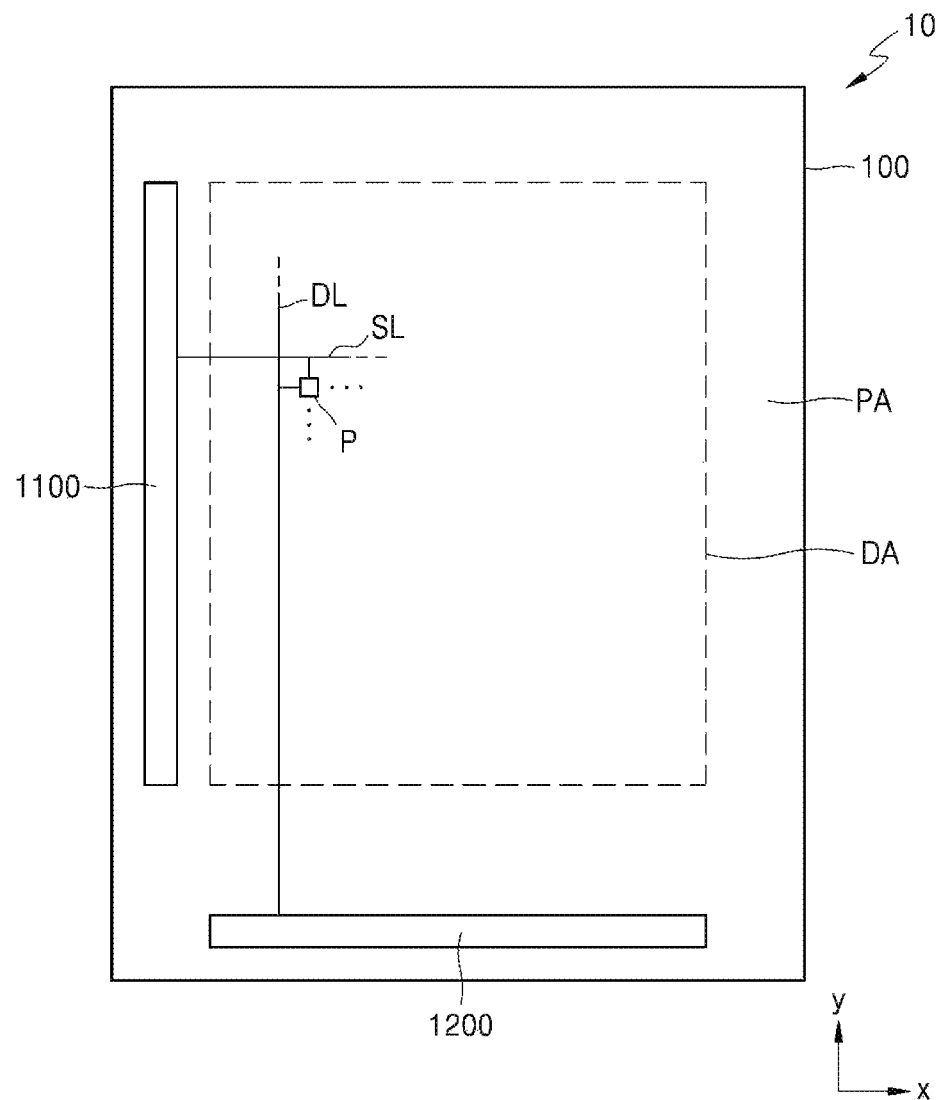
FIG. 2 is a plan view schematically illustrating a display panel according to an embodiment.
Figure 3:
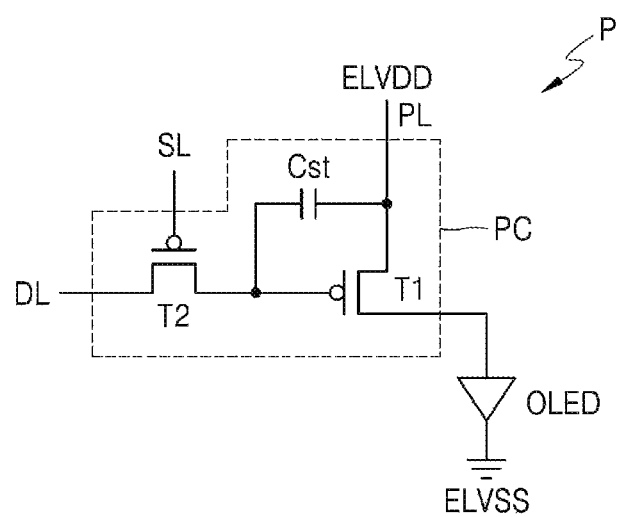
FIG. 3 is an equivalent circuit diagram schematically illustrating one pixel of the display panel.

FIG. 2 is a plan view schematically illustrating a display panel according to an embodiment, and FIG. 3 is an equivalent circuit diagram schematically illustrating one pixel of the display panel.

Referring to FIG. 2, the display panel 10 includes a display area DA and a peripheral area PA. FIG. 2 illustrates an appearance of the substrate 100 of the display panel 10. For example, it will be understood that the substrate 100 has the display area DA and the peripheral area PA.

The display panel 10 includes pixels P arranged in the display area DA. Each of the pixels P includes a pixel circuit PC and an organic light-emitting display device (OLED) as a display element connected to the pixel circuit PC, as shown in FIG. 3. The pixel circuit PC may include a first transistor T1, a second transistor T2, and a capacitor Cst. Each pixel P may emit, for example, red, green, blue, or white light through the OLED. The first transistor T1 and the second transistor T2 may be implemented with a thin-film transistor (TFT).

The second transistor T2 may be a switching transistor that may be connected to a scan line SL and a data line DL and may transmit a data signal input from the data line DL to the first transistor T1 according to a switching voltage input from the scan line SL. The capacitor Cst may be connected to the second transistor T2 and a power line PL and may store a voltage that corresponds to a difference between a voltage corresponding to the data signal transmitted from the second transistor T2 and a first power supply voltage ELVDD supplied to the power line PL.

The first transistor T1 may be a driving transistor may be connected to the power line PL and the capacitor Cst and may control a driving current that flows through the OLED from the power line PL according to a value of a voltage stored in the capacitor Cst. The OLED may emit light having certain brightness due to a driving current. A second electrode, for example, a cathode, of the OLED may receive a second power supply voltage ELVSS.

FIG. 3 illustrates that the pixel circuit PC includes two transistors and one capacitor. However, embodiments are not limited thereto. For example, the number of transistors and the number of capacitors may be variously modified according to a design of the pixel circuit PC.

Referring back to FIG. 2, a scan driver 1100 that provides a scan signal to each pixel P, a data driver 1200 that provides a data signal to each pixel P, supply lines (e.g., a clock signal line, a carry signal line, and a driving voltage line, etc.) that provide signal input to the scan driver 1100 and the data driver 1200, and a main power line for providing the first power supply voltage ELVDD and the second power supply voltage ELVSS may be arranged in the peripheral area PA. FIG. 3 illustrates that the data driver 1200 is adjacent to one side of the substrate 100. However, in another embodiment, the data driver 1200 may be positioned on a flexible Printed circuit board (FPCB) and electrically connected to a pad positioned on one side of the display panel 10.

Figure 4:
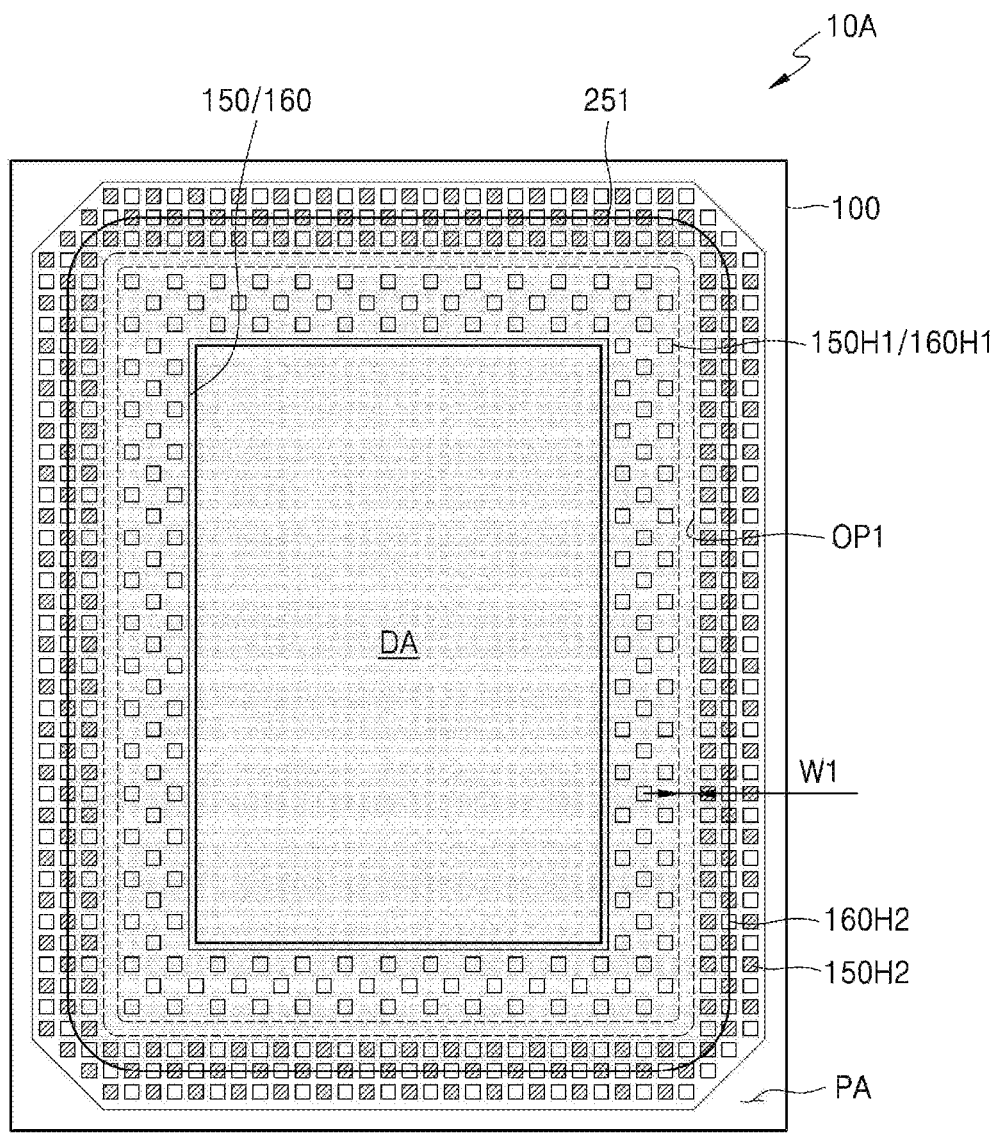
FIG. 4 is a plan view schematically illustrating a peripheral area of the display panel according to an embodiment.
Figure 5:
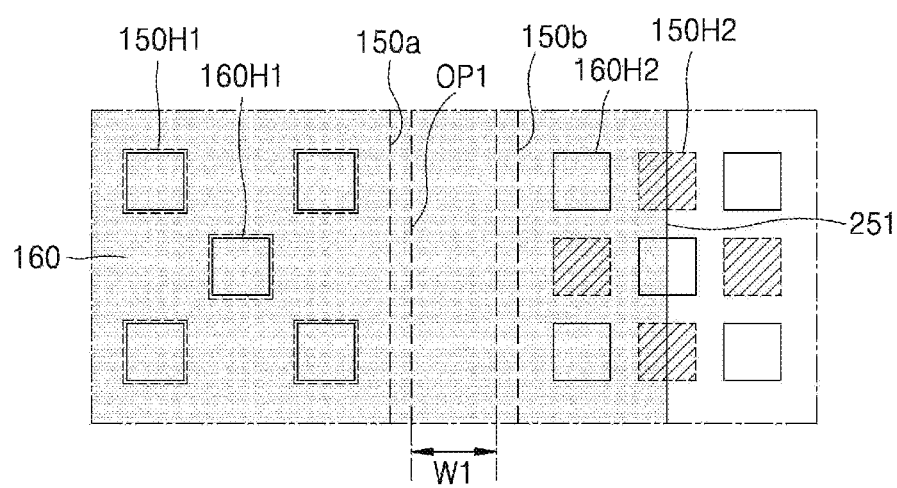
FIG. 5 is an enlarged plan view schematically illustrating part of the display panel of FIG. 4.
Figure 6:
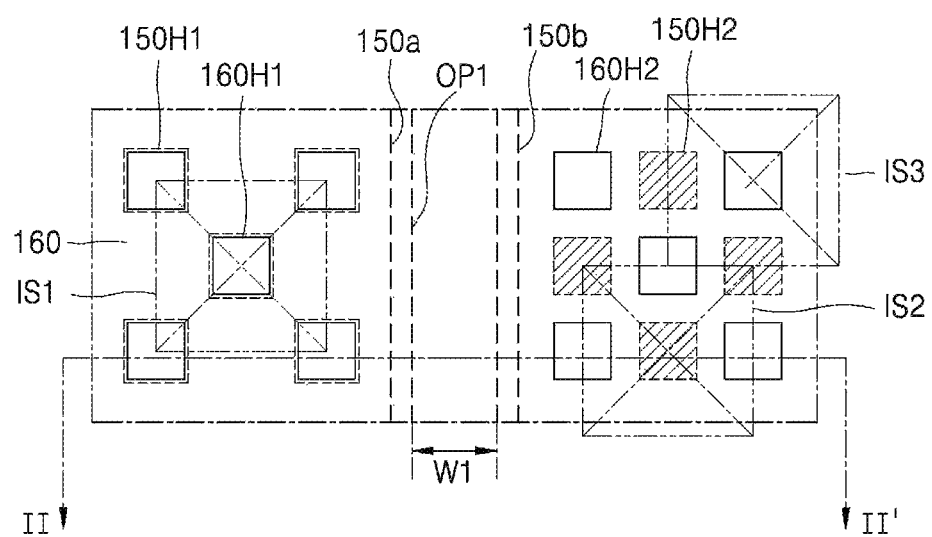
FIG. 6 is a view omitting part of the configuration of FIG. 5.
Figure 7:
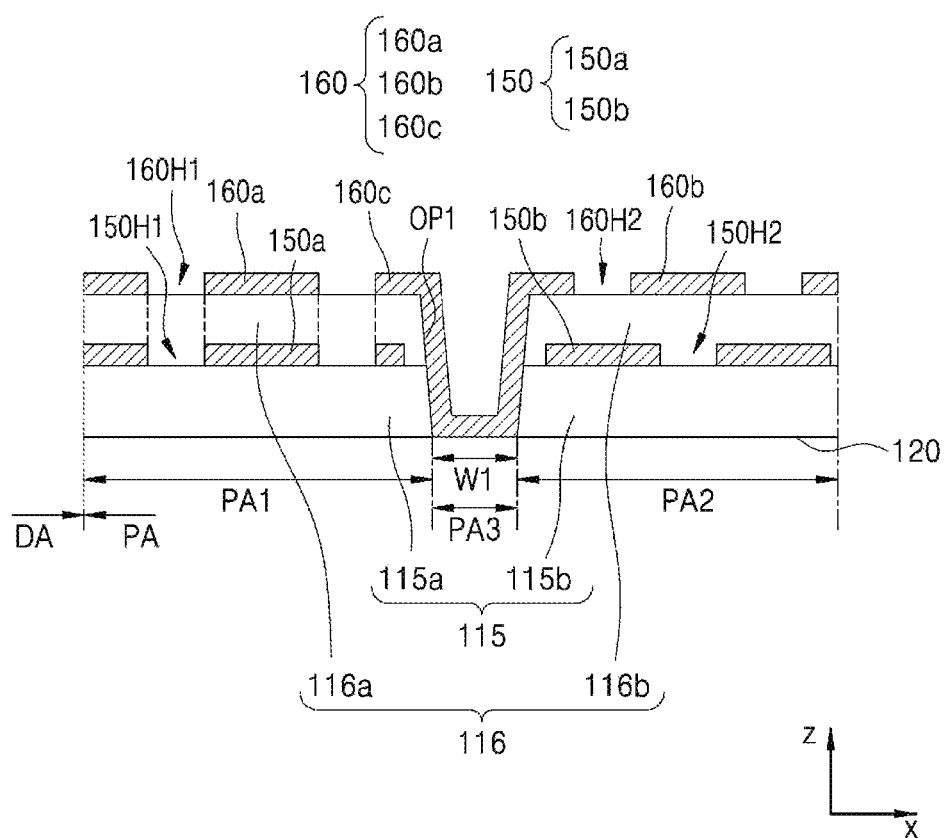
FIG. 7 is a cross-sectional view taken along line II-IF of FIG. 6.

FIG. 4 is a plan view schematically illustrating a peripheral area of the display panel according to an embodiment, FIG. 5 is an enlarged plan view schematically illustrating part of the display panel of FIG. 4, FIG. 6 is a view omitting part of the configuration of FIG. 5, and FIG. 7 is a cross-sectional view taken along a line II-IF of FIG. 6.

Referring to FIGS. 4 through 7, a display panel 10A according to an embodiment includes a substrate 100 having a display area DA and a peripheral area PA outside the display area DA.

A first conductive layer 150 and a second conductive layer 160 on the first conductive layer 150 may be positioned in the peripheral area PA. The first conductive layer 150 may be positioned on a first insulating layer 115. The first insulating layer 115 may be positioned on an insulation surface 120. The insulation surface 120 may be a top surface of the substrate 100 or a top surface of at least one insulating layer above the substrate 100. A second insulating layer 116 may be positioned between the first conductive layer 150 and the second conductive layer 160.

A first opening OP1, through which the first insulating layer 115 and the second insulating layer 116 are penetrated, may be formed in the first insulating layer 115 and the second insulating layer 116. A width W1 of the first opening OP1 may be a width of an opened surface that contacts the insulation surface 120. The first opening OP1 may surround a periphery of the display area DA. The first opening OP1 may form a closed loop that surrounds the periphery of the display area DA completely. Thus, the first insulating layer 115 may include a first area 115a and a second area 115b, which are separated from each other based on the first opening OP1. Similarly, the second insulating layer 116 may include a first area 116a and a second area 116b, which are separated from each other based on the first opening OP1. Hereinafter, a peripheral area between the display area DA and the first opening OP1 is referred to as a first peripheral area PA1, and a peripheral area between the first opening OP1 and edges of the substrate 100 is referred to as a second peripheral area PA2, and an area including the first opening OP1 between the first peripheral area PA1 and the second peripheral area PA2 is referred to as a third peripheral area PA3.

The first conductive layer 150 may surround the periphery of the display area DA. The first conductive layer 150 may include a first area 150a and a second area 150b, which are separated from each other based on the first opening OP1. The first area 150a of the first conductive layer 150 may be in the first peripheral area PA1, and the second area 150b of the first conductive layer 150 may be in the second peripheral area PA2. The first conductive layer 150 may have a first hole pattern including first holes 150H1 with certain patterns arranged in the first area 150a and second holes 150H2 with certain patterns arranged in the second area 150b.

In FIG. 6, a second electrode 251 is omitted from FIG. 5 to more clearly illustrate the above first and second hole patterns. The first holes 150H1 of the first conductive layer 150 may be spaced apart from one another by a certain distance in an x-direction and a y-direction so as not to overlap one another when disposed on a plane, which may be a plane that is parallel to the surface of the substrate 100. For example, the first holes 150H1 of the first conductive layer 150 may be adjacent to at least one of four vertices of a virtual rectangle IS1. The second holes 150H2 of the first conductive layer 150 may be spaced apart from one another by a certain distance in the x-direction and the y-direction so as not to overlap one another on the plane. For example, the second holes 150H2 of the first conductive layer 150 may be adjacent to at least one of four vertices of a virtual rectangle IS2.

The second conductive layer 160 may surround the periphery of the display area DA. The second conductive layer 160 may be positioned on the first conductive layer 150 and may overlap the first conductive layer 150. The second conductive layer 160 may cover, i.e., be disposed over, the first opening OP1. The second conductive layer 160 may include a first area 160a in the first peripheral area PA1, a second area 160b in the second peripheral area PA2, and a third area 160c in the first opening OP1. The second conductive layer 160 may have a second hole pattern including third holes 160H1 with certain patterns arranged in the first area 160a and fourth holes 160H2 with certain patterns arranged in the second area 160b.

Referring to FIG. 6, the third holes 160H1 of the second conductive layer 160 may be spaced apart from one another by a certain distance in the x-direction and the y-direction and may not overlap one another on the plane. The third holes 160H1 of the second conductive layer 160 may be arranged to overlap the first holes 150H1 of the first conductive layer 150 when disposed on the plane. For example, the third holes 160H1 may be adjacent to at least one of four vertices of the virtual rectangle IS1. The fourth holes 160H2 of the second conductive layer 160 may be spaced apart from one another by a certain distance in the x-direction and the y-direction so as not to overlap one another when disposed on the plane. For example, the fourth holes 160H2 of the second conductive layer 160 may be adjacent to at least one of four vertices of a virtual rectangle IS3 based on each of the fourth holes 160H of the second conductive layer 160. The fourth holes 160H2 of the second conductive layer 160 may be arranged not to overlap the second holes 150H2 of the first conductive layer 150 when disposed on the plane. For example, the second holes 150H2 of the first conductive layer 150 may be arranged between the fourth holes 160H2 of the second conductive layer 160 adjacent in the x-direction and/or the y-direction. The fourth holes 160H2 of the second conductive layer 160 may be arranged between the second holes 150H2 of the first conductive layer 150 adjacent in the x-direction and/or the y-direction.

Referring to FIG. 7, in the first peripheral area PA1, at least a portion of the first holes 150H1 of the first conductive layer 150 and at least a portion of the third holes 160H1 of the second conductive layer 160 may overlap each other in a z-direction (a vertical direction). In the second peripheral area PA2, the second holes 150H2 of the first conductive layer 150 and the fourth holes 160H2 of the second conductive layer 160 do not overlap each other in the z-direction (i.e., the vertical direction) and may be arranged in a zigzag pattern so as to cross one another when disposed on the plane. That is, in the first peripheral area PA1, the first hole pattern of the first conductive layer 150, which includes the first holes 150H1, and the second hole pattern of the second conductive layer 160, which includes the third holes 160H1 may coincide with each other, and in the second peripheral area PA2, the first hole pattern of the first conductive layer 150, which includes the second holes 150H2, and the second hole pattern of the second conductive layer 160, which includes the fourth holes 160H2, may cross each other, respectively to dispose the holes as discussed above. Referring back to FIGS. 4 and 5, a second electrode (see 251 of FIGS. 13 and 14) of the OLED may be positioned on the first conductive layer 150 and the second conductive layer 160. The second electrode 251 of the OLED may cover the display area DA and may extend to cover a portion of the peripheral area PA. The second electrode 251 of the OLED may cover the first peripheral area PA1 and the second peripheral area PA3. The second electrode 251 of the OLED may cover a portion of the second peripheral area PA2 around the first opening OP1.

Thus, an example arrangement of the first holes 150H1 and the second holes 150H2 of the first conductive layer 150 and the third holes 160H1 and the fourth holes 160H2 of the second conductive layer 160 has been provided, as discussed above.

With continuing reference to FIGS. 4-7, such an example arrangement disposes the first holes 150H1 and the third holes 160H1 to overlap, i.e., coincide with each other in the first peripheral area PA1 to face each other, such that the first holes 150H1 and the third holes 160H1 are aligned to register with each other, when viewed in a plan view or a cross-sectional view. However, in the second peripheral area, such an example arrangement disposes the second holes 150H2 and the fourth holes 160H2 to cross or not overlap, i.e., not coincide with each other, such that the second holes 150H2 and the fourth holes 160H2 are not registered with each other so as to be offset or spatially opposed to each other, both in their positioning and sequence in the x or y direction. Thus, when viewed in plan and cross-sectional views, the second holes 150H2 are spaced from the fourth holes 160H2 and alternate in positioning and sequence with the fourth holes 160H2.

Figure 8:
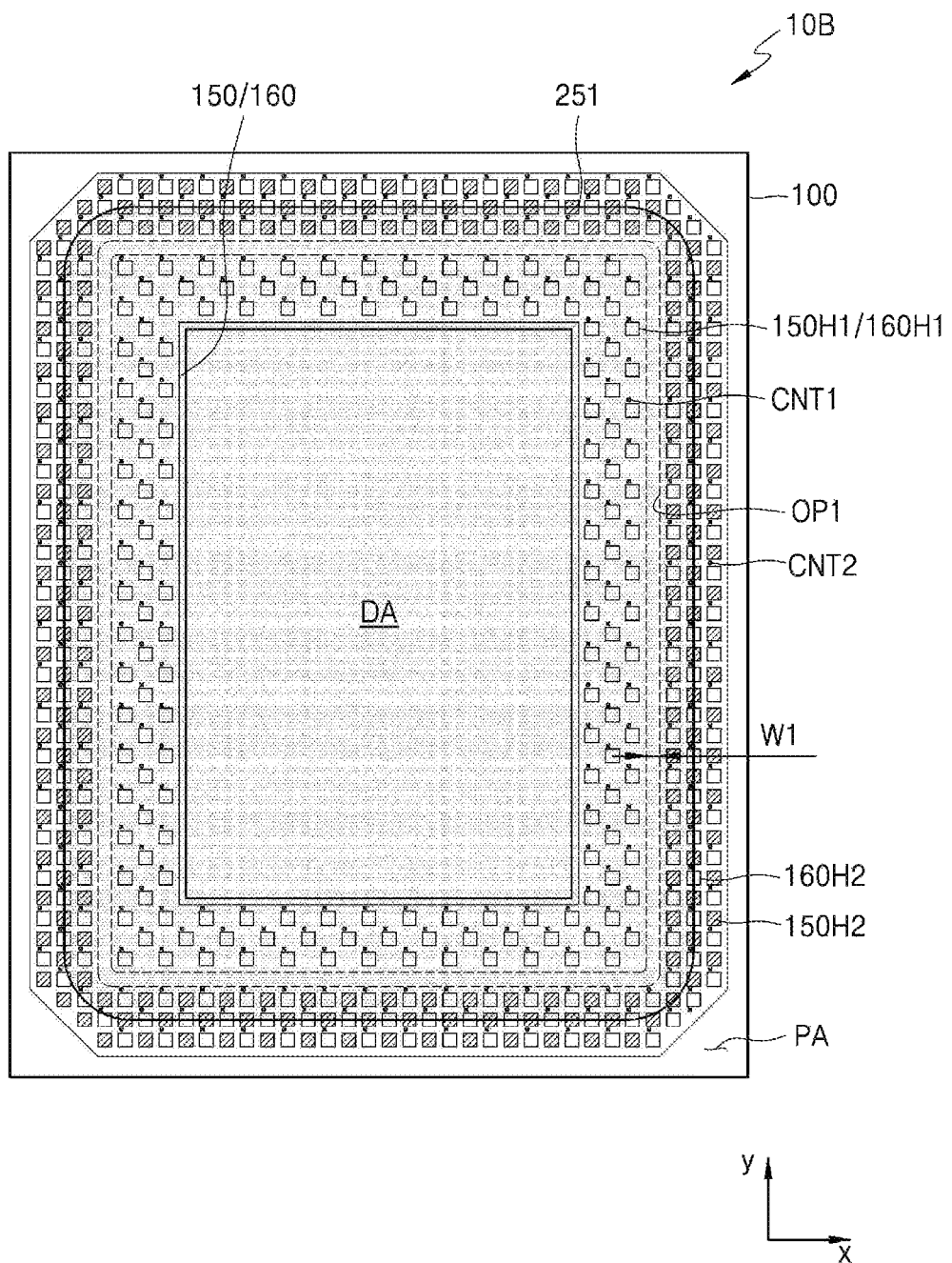
FIG. 8 is a plan view schematically illustrating a peripheral area of a display panel according to another embodiment.
Figure 9:
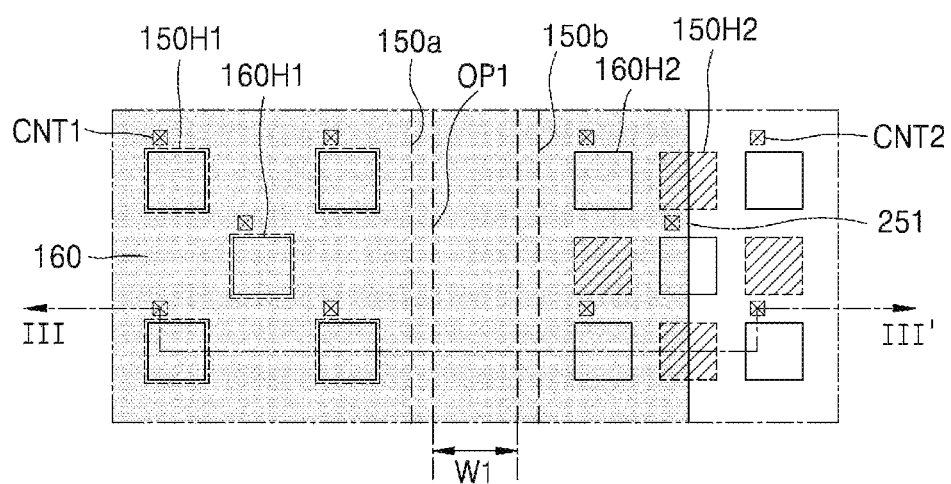
FIG. 9 is a plan view schematically illustrating part of the display panel of FIG. 8.
Figure 10:
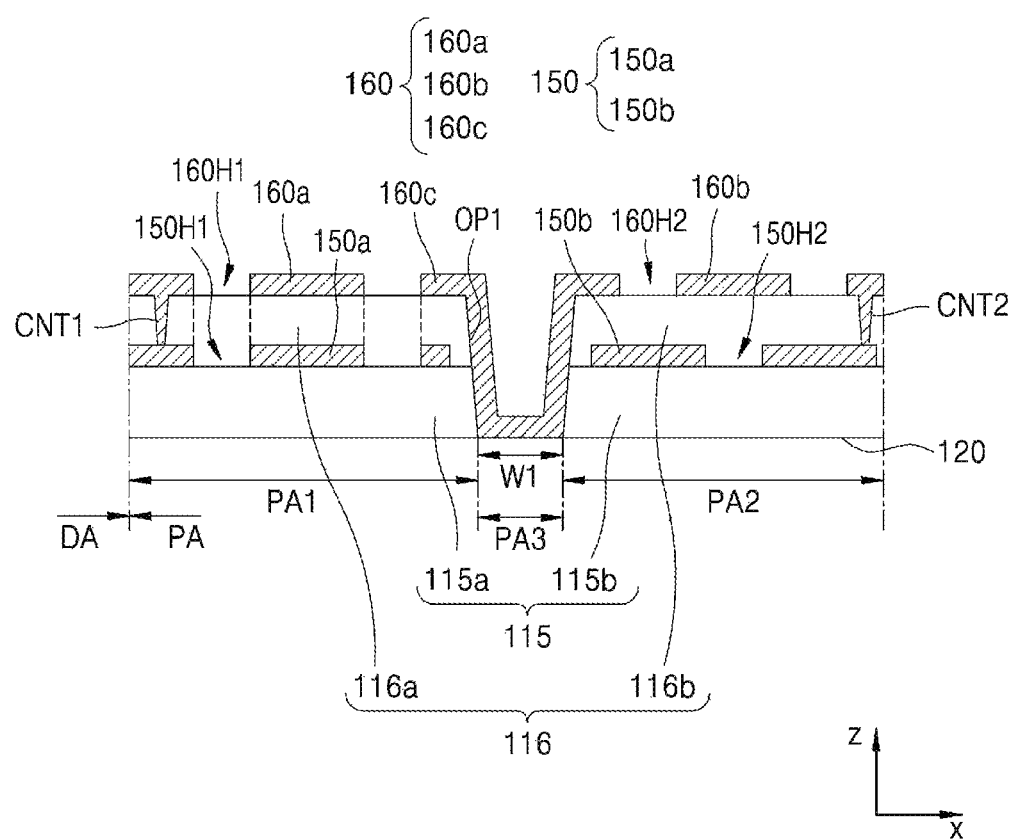
FIG. 10 is a cross-sectional view taken along line of FIG. 9.

FIG. 8 is a plan view schematically illustrating a peripheral area of a display panel according to another embodiment, and FIG. 9 is a plan view schematically illustrating part of the display panel of FIG. 8, and FIG. 10 is a cross-sectional view taken along a line of FIG. 9. In FIG. 10, the second electrode 251 of FIG. 9 is omitted.

In an embodiment of FIG. 8, the first conductive layer 150 and the second conductive layer 160 may be electrically connected to each other via first and second contact parts CNT1 and CNT2 that may be added to the embodiment of FIG. 4. Hereinafter, a detailed description of the same configuration as that of FIGS. 4 through 7 will be omitted.

Referring to FIGS. 8 through 10, a display panel 10B according to an embodiment includes a substrate 100 having a display area DA and a peripheral area PA outside the display area DA. The peripheral area PA may include a first peripheral area PA1 between the display area DA and the first opening OP1 and a second peripheral area PA2 between the first opening OP1 and edges of the substrate 100.

The first insulating layer 115 and the second insulating layer 116 may be arranged in the display area DA and the peripheral area PA, and the first opening OP1 through which the first insulating layer 115 and the second insulating layer 116 are penetrated, may be in the peripheral area PA.

The first conductive layer 150 may include a first area 150a in the first peripheral area PA1 and a second area 150b in the second peripheral area PA2, which are separated from each other based on the first opening OP1. The first conductive layer 150 may include a first hole pattern including first holes 150H1 with certain patterns arranged in the first area 150a and second holes 150H2 with certain patterns arranged in the second area 150b. The second conductive layer 160 may include a first area 160a in the first peripheral area PA1, a second area 160b in the second peripheral area PA2, and a third area 160c in the first opening OP1. The second conductive layer 160 may include a second hole pattern including third holes 160H1 with certain patterns arranged in the first area 160a and fourth holes 160H2 with certain patterns arranged in the second area 160b.

In the first peripheral area PA1, at least a portion of the first holes 150H1 of the first conductive layer 150 and at least a portion of the third holes 160H1 of the second conductive layer 160 may overlap in the z-direction (i.e., a vertical direction). In the second peripheral area PA2, the second holes 150H2 of the first conductive layer 150 and the fourth holes 160H2 of the second conductive layer 160 may not overlap in the z-direction, but may be arranged in a zigzag pattern so as to cross one another when disposed on the plane.

In the first peripheral area PA1, the first conductive layer 150 and the second conductive layer 160 may be electrically connected to each other at the first contact part CNT1. The second insulating layer 116 may include a contact hole in the first contact part CNT1, and the first conductive layer 150 and the second conductive layer 160 may be electrically connected to each other via a contact hole of the first contact part CNT1. In the second peripheral area PA2, the first conductive layer 150 and the second conductive layer 160 may be electrically connected to each other at the second contact part CNT2. The second insulating layer 116 may include a contact hole in the second contact part CNT2, and the first conductive layer 150 and the second conductive layer 160 may be electrically connected to each other via the contact hole in the second contact part CNT2.

A second electrode 251 of the OLED may be positioned on the first conductive layer 150 and the second conductive layer 160. The second electrode 251 of the OLED may cover the display area DA and may extend to cover a portion of the peripheral area PA.

In an embodiment, the first opening OP1 is formed in the peripheral area PA so that the peripheral area PA may be separated from the display area DA. Thus, gas generated in the first insulating layer 115 and the second insulating layer 116 outside the first opening OP1, e.g., from the second peripheral area PA2 away from the display area DA, may be prevented from reaching an inside of the display area DA.

In an embodiment, hole patterns of the first conductive layer 150 and the second conductive layer 160 stacked in the peripheral area PA are asymmetric with respect to the first opening OP1 of the first insulating layer 115 and the second insulating layer 116. That is, such hole patterns may not mirror each other, such that they are disposed differently with respect to the first opening OP1.

In contrast to the embodiments herein, in an instance that, in the first peripheral area PA1, the first holes 150H1 of the first conductive layer 150 and the third holes 160H1 of the second conductive layer 160 do not overlap one another and cross one another, gas generated in the first insulating layer 115 is delayed by the first conductive layer 150 and is not easily discharged. Thus, shrinkage may occur in the display device 1. However, in the disclosed embodiments, in the first peripheral area PA1, the first holes 150H1 of the first conductive layer 150 and the third holes 160H1 of the second conductive layer 160 overlap one another. As such, gases of the first insulating layer 115 and the second insulating layer 116 may be easily discharged to the outside so that shrinkage of the display device 1 may be prevented. That is, gas generated by the first insulating layer 115 may pass through the first holes 150H1, and then into the second insulating layer 116 for discharge, with or without gas that may be generated by the second insulating layer 116, through the third openings 160H1.

Also, in an embodiment, the second holes 150H2 of the first conductive layer 150 and the fourth holes 160H2 of the second conductive layer 160 cross one another in the second peripheral area PA2. Thus, in the second peripheral area PA2, the arrangement due to the second holes 150H2 and the fourth holes 160H2 may enable the first conductive layer 150 and the second conductive layer 160 to prevent coupling between signal lines to which varying voltages (i.e., not constant voltages) are applied when such signal lines are disposed below the first conductive layer 150 and above the second conductive layer 160. For example, in the second peripheral area PA2, the first conductive layer 150 and the second conductive layer 160 may prevent coupling between a signal line (for example, a clock signal line of a driver) below the first conductive layer 150 and a signal line (for example, a sensing signal line of an input-sensing layer) above the second conductive layer 160.

Shapes, sizes, and densities of the first holes 150H1 and the second holes 150H2 of the first conductive layer 150 and the third holes 160H1 and the fourth holes 160H2 of the second conductive layer 160 shown in FIGS. 4 and 7 are exemplary. Thus, the shapes of the first holes 150H1 and the second holes 150H2 of the first conductive layer 150 and the third holes 160H1 and the fourth holes 160H2 of the second conductive layer 160 may be rectangles, circles, ovals, or polygons and may have other different shapes and sizes.

The first conductive layer 150 and the second conductive layer 160 shown in FIGS. 4 and 8 are positioned to completely surround the periphery of the display area DA along four sides of an outer circumference of the substrate 100 and form a closed loop. However, embodiments are not limited thereto. For example, the first conductive layer 150 and the second conductive layer 160 may be positioned at at least one side of four sides of the substrate 100. In an embodiment, the first conductive layer 150 and the second conductive layer 160 may be positioned along the remaining three sides excluding a side at which the data driver 1200 is positioned, and may have a "⌐"-shape.

Figure 11:
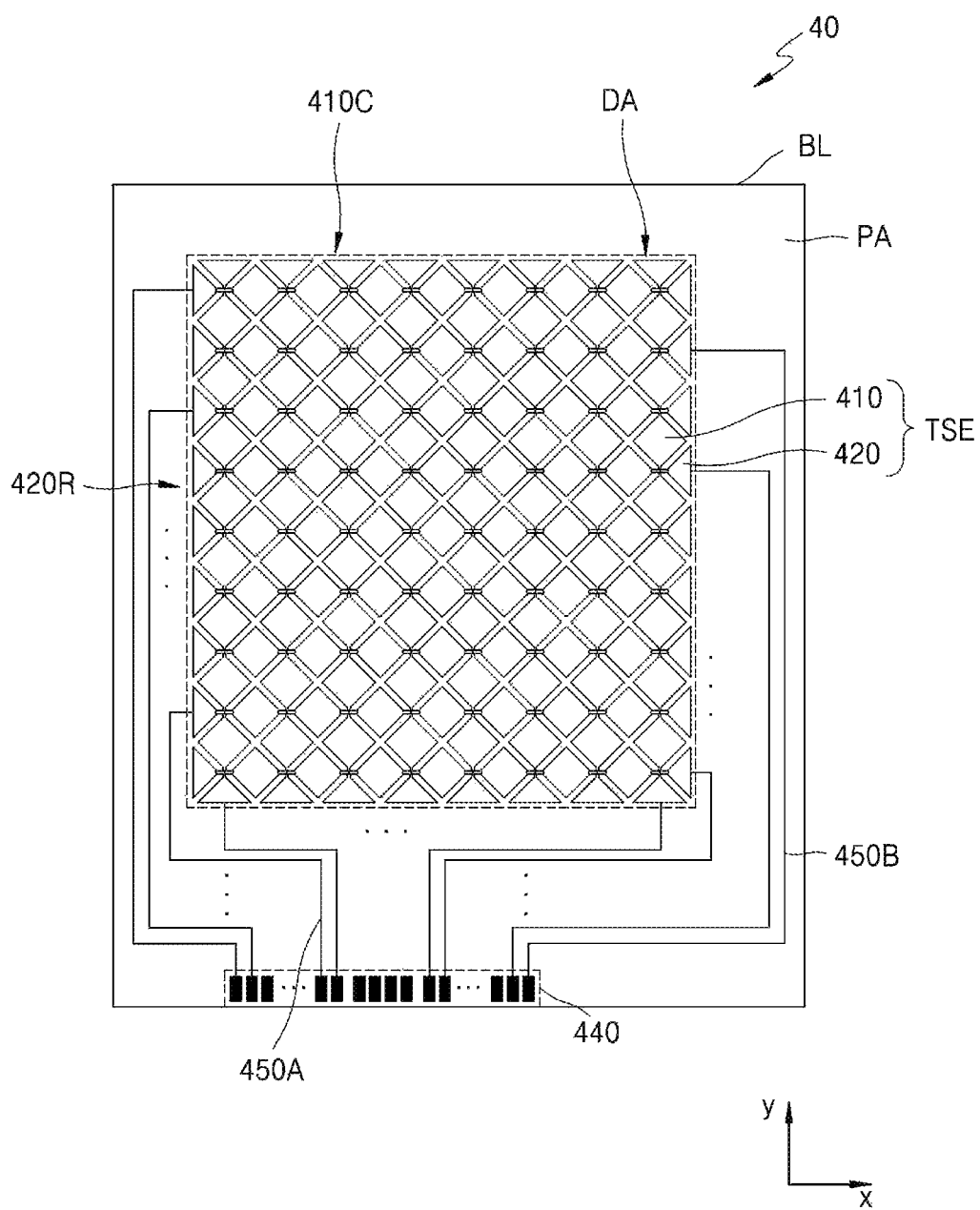
FIG. 11 is a plan view schematically illustrating an input-sensing layer according to an embodiment.

FIG. 11 is a plan view schematically illustrating an input-sensing layer according to an embodiment.

Referring to FIG. 11, an input-sensing layer 40 may include a base layer BL including a display area DA and a peripheral area PA. The base layer BL may correspond to the shape of the substrate 100 of the display panel 10 and may be provided as substantially the same shape as that of the substrate 100. In an embodiment, the base layer BL may be a portion of an encapsulation layer (see 300 of FIGS. 13 and 14) of the display panel 10, and, for example, may be a second inorganic encapsulation layer 330 positioned on an uppermost layer of the encapsulation layer 300. In another embodiment, the base layer BL may be an insulation substrate or insulation film formed of an insulating material, such as glass or a polymer resin, which is formed separately from the encapsulation layer 300.

Sensing electrodes TSE may be positioned in the display area DA. Sensing signal lines connected to the sensing electrodes TSE may be positioned in the peripheral area PA. The sensing electrodes TSE may include first sensing electrodes 410 and second sensing electrodes 420. The sensing signal lines may include first sensing signal lines 450A and second sensing signal lines 450B. That is, the input-sensing layer 40 may include first sensing electrodes 410, first sensing signal lines 450A connected to the first sensing electrodes 410, second sensing electrodes 420, and second sensing signal lines 450B connected to the second sensing electrodes 420. The input-sensing layer 40 may sense an external input using a mutual cap method and/or self cap method.

The first sensing electrodes 410 and the second sensing electrodes 420 may have approximately diamond shapes. The first sensing electrodes 410 and the second sensing electrodes 420 may have a grid structure (or a lattice structure) having holes therein. A line width of each of lattice lines may be several micrometers. Holes of the first sensing electrodes 410 and the second sensing electrodes 420 may correspond to an emission area (i.e., an area in which an emission layer is disposed) of the OLED 200.

The first sensing electrodes 410 may be arranged in a y-direction, and the second sensing electrodes 420 may be arranged in the x-direction that crosses the y-direction. The first sensing electrodes 410 arranged in the y-direction may be connected to one another via a first connection electrode between the neighboring first sensing electrodes 410 and may form first sensing lines 410C. The second sensing electrodes 420 arranged in the x-direction may be connected to one another via a second connection electrode between the neighboring second sensing electrodes 420 and may form second sensing lines 420R. The first sensing lines 410C and the second sensing lines 420R may cross one another. For example, the first sensing lines 410C and the second sensing lines 420R may be perpendicular to one another.

The first sensing lines 410C and the second sensing lines 420R may be arranged in the display area DA and may be connected to a sensing signal pad 440 via first sensing signal lines 450A and second sensing signal lines 450B in the peripheral area PA. The first sensing lines 410C may be connected to the first sensing signal lines 450A, and the second sensing lines 420R may be connected to the second sensing signal lines 450B.

The first sensing electrodes 410 and the second sensing electrodes 420 may be formed on the same layer. The first sensing electrodes 410 may be connected to one another via connection electrodes formed on different layers. The second sensing electrodes 420 may be connected to one another via connection electrodes formed on the same layer. At least one insulating layer may be arranged between connection electrodes arranged on a different layer from a layer on which the first and second sensing electrodes 410 and 420 are arranged.

The first sensing electrodes 410 and the second sensing electrodes 420 may include metal. For example, the first sensing electrodes 410 and the second sensing electrodes 420 may include molybdenum (Mo), aluminum (Al), copper (Cu), and titanium (Ti) and may have a multi-layer or single layer structure including the above-described materials. In an embodiment, the first sensing electrodes 410 and the second sensing electrodes 420 may have a multi-layer structure of Ti/Al/Ti.

Figure 12:
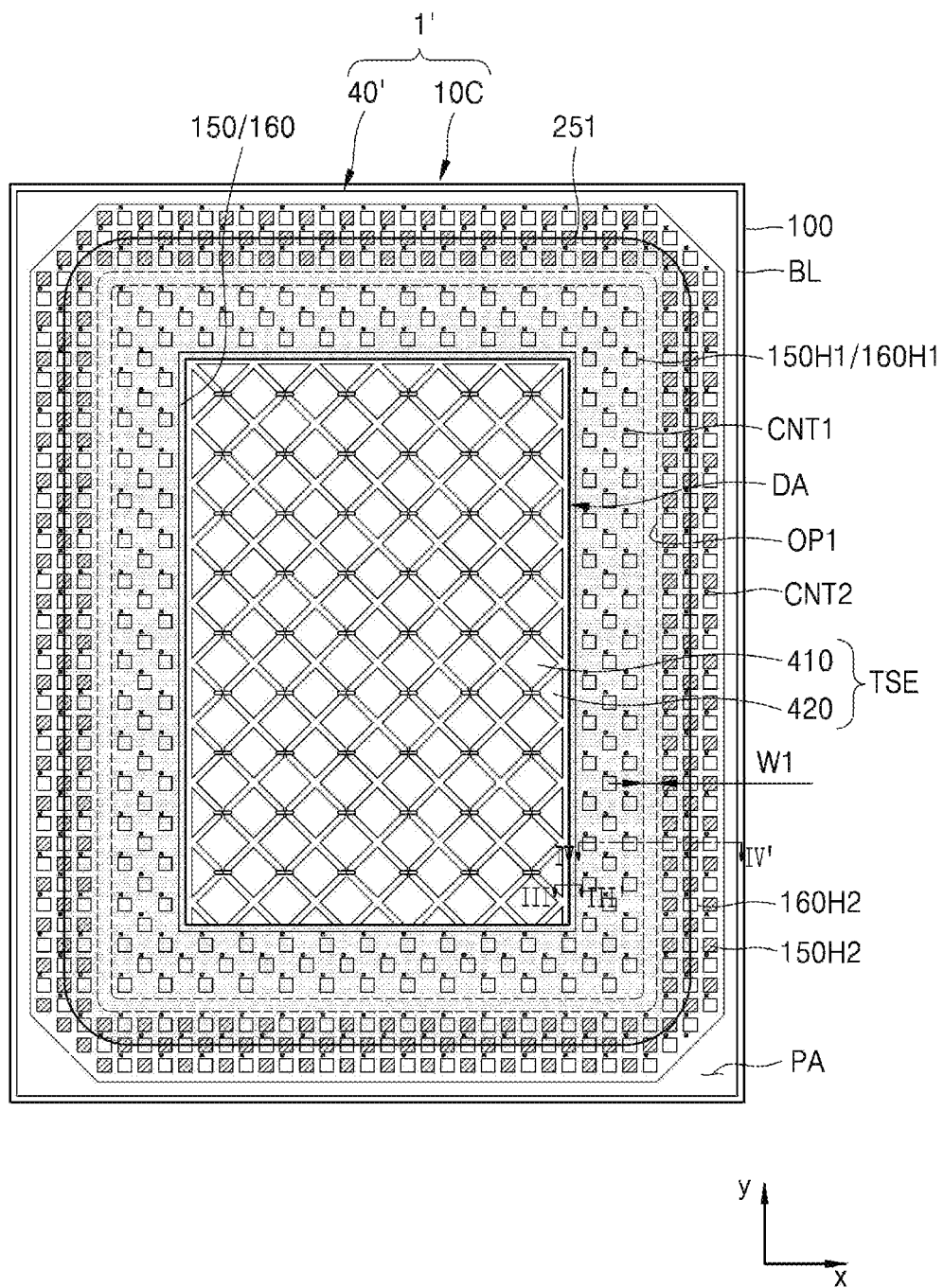
FIG. 12 is a plan view schematically illustrating a display panel and an input-sensing layer of a display device according to an embodiment.

FIG. 12 is a plan view schematically illustrating a display panel and an input-sensing layer of a display device according to an embodiment. Hereinafter, a detailed description that is the same as a description of FIGS. 8 and 11 will be omitted.

Referring to FIG. 12, a display device 1' according to an embodiment may include a display panel 10C and an input-sensing layer 40'.

The display panel 10C includes a substrate 100 having a display area DA and a peripheral area PA outside the display area DA. The peripheral area PA may include a first peripheral area PA1 between the display area DA and the first opening OP1 and a second peripheral area PA2 between the first opening OP1 and edges of the substrate 100.

A first conductive layer 150 and a second conductive layer 160 may be arranged in the peripheral area PA.

The first conductive layer 150 may have a first hole pattern including first holes 150H1 with certain patterns arranged in the first peripheral area PA1 and second holes 150H2 with certain patterns arranged in the second peripheral area PA2, in which the first and second peripheral areas PA1 and PA2 are separated from one another based on the first opening OP1. The second conductive layer 160 may have a second hole pattern including third holes 160H1 with certain patterns arranged in the first peripheral area PA1 and fourth holes 160H2 with certain patterns arranged in the second peripheral area PA2.

In the first peripheral area PA1, at least a portion of the first holes 150H1 of the first conductive layer 150 and at least a portion of the third holes 160H1 of the second conductive layer 160 may overlap one another when disposed on the plane. In the second peripheral area PA2, the second holes 150H2 of the first conductive layer 150 and the fourth holes 160H2 of the second conductive layer 160 may not overlap one another when disposed on the plane and may be arranged in a zigzag pattern so as to cross one another. In the first peripheral area PA1, the first conductive layer 150 and the second conductive layer 160 may be electrically connected to each other at a first contact part CNT1. In the second peripheral area PA2, the first conductive layer 150 and the second conductive layer 160 may be electrically connected to each other at a second contact part CNT2.

A second electrode 251 of the OLED may be positioned on the first conductive layer 150 and the second conductive layer 160. The second electrode 251 of the OLED may cover the display area and may extend to cover a portion of the peripheral area PA.

An input-sensing layer 40' may be positioned on the display panel 10C. The input-sensing layer 40' may include sensing electrodes TSE arranged in the display area DA of the base layer BL. The sensing electrodes TSE may include first sensing electrodes 410 and second sensing electrodes 420. Although not shown, first sensing signal lines (see 450A of FIG. 11) connected to the first sensing electrodes 410 and second sensing signal lines (see 450B of FIG. 11) connected to the second sensing electrodes 420 may be positioned in the peripheral area PA of the base layer BL. The base layer BL may be a portion of an encapsulation layer 300 of the display panel 10C, or an insulation substrate or insulation film formed separately with the encapsulation layer 300.

In the above embodiment, there is thus an example arrangement disposes the first holes 150H1 and the third holes 160H1 to overlap, i.e., coincide with each other in the first peripheral area PA1 to face each other, such that the first holes 150H1 and the third holes 160H1 are aligned to register with each other, when viewed in a plan view or a cross-sectional view. However, in the second peripheral area, such an example arrangement disposes the second holes 150H2 and the fourth holes 160H2 to cross or not overlap, i.e., not coincide with each other, such that the second holes 150H2 and the fourth holes 160H2 are not registered with each other so as to be offset or spatially opposed to each other, both in their positioning and sequence in the x or y direction. Thus, when viewed in plan and cross-sectional views, the second holes 150H2 are spaced from the fourth holes 160H2 and alternate in positioning and sequence with the fourth holes 160H2.

Figure 13:
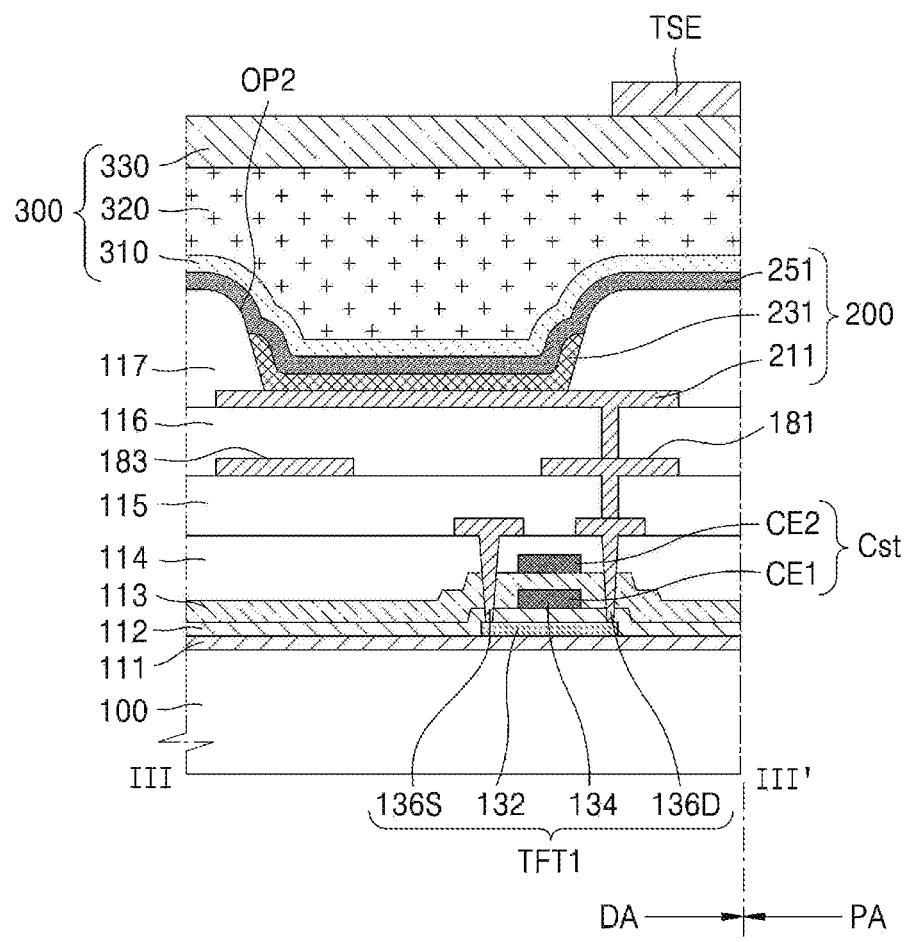
FIG. 13 is a sectional view schematically illustrating part of a display area that is adjacent a peripheral area taken along line of FIG. 12.
Figure 14:
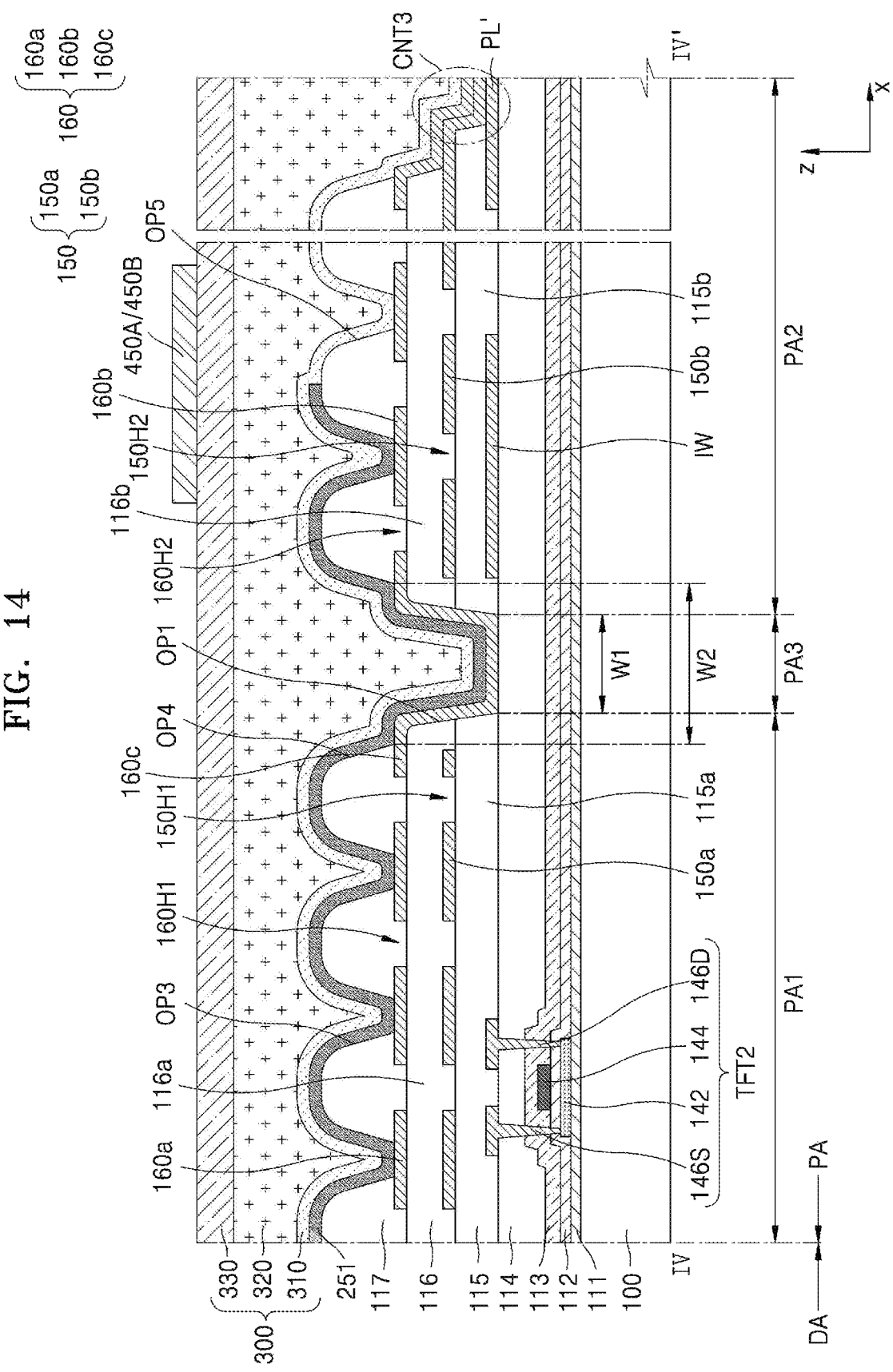
FIG. 14 is a sectional view schematically illustrating part of a peripheral area that is adjacent a display area taken along line IV-IV' of FIG. 12.

FIG. 13 is a sectional view schematically illustrating part of a display area that is adjacent a peripheral area taken along line of FIG. 12, and FIG. 14 is a sectional view schematically illustrating part of a peripheral area that is adjacent a display area taken along line IV-IV' of FIG. 12. Hereinafter, a description will be provided with reference to FIGS. 13 and 14.

A buffer layer 111 may be positioned on the substrate 100 so as to prevent impurities from penetrating into a semiconductor layer of a TFT.

The substrate 100 may be formed of various materials, such as glass, metal material, or plastics. In an embodiment, the substrate 100 may be a flexible substrate. For example, the substrate 100 may include a polymer resin, such as polyethersulphone (PES), polyacrylate, polyetherimide (PEI), polyethylene napthalate (PEN), polyethylene terephthalate (PET), polyphenylene sulfide (PPS), polyarylate (PAR), polyimide (PI), polycarbonate (PC), or cellulose acetate propionate (CAP).

The buffer layer 111 may include an inorganic insulating material, such as silicon nitride or silicon oxide, and may have a single layer or multi-layer structure.

A first TFT TFT1, a capacitor Cst, and an OLED 200 electrically connected to the first TFT TFT1 may be positioned in the display area DA of the substrate 100. The OLED 200 electrically connected to the first TFT TFT1 may may include a first electrode 211 that is electrically connected to the first TFT TFT1. The first TFT TFT1 may be a first transistor T1 of FIG. 3.

The first TFT TFT1 may include a semiconductor layer 132, a gate electrode 134, a source electrode 136S, and a drain electrode 136D. The semiconductor layer 132 may include amorphous silicon, polycrystalline silicon, or an organic semiconductor material. In consideration of adhesion with an adjacent layer, surface flatness of a stacked layer and workability, the gate electrode 134 may be formed of one or more materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example, and may have a single layer or multi-layer structure.

In order to attain an insulation property between the semiconductor layer 132 and the gate electrode 134, a gate insulating layer 112 including an inorganic material, such as silicon oxide, silicon nitride and/or silicon oxynitride, may be interposed between the semiconductor layer 132 and the gate electrode 134. The first interlayer insulating layer 113 and a second interlayer insulating layer 114 including an inorganic material, such as silicon oxide, silicon nitride and/or silicon oxynitride, may be positioned between the gate electrode 134 and the source electrode 136S and the drain electrode 136D. Each of the source electrode 136S and the drain electrode 136D may be electrically connected to the semiconductor layer 132 via a contact hole formed in the gate insulating layer 112, the first interlayer insulating layer 113, and the second interlayer insulating layer 114.

To provide conductivity, the source electrode 136S and the drain electrode 136D may be formed of one or more materials selected from the group consisting of Al, Pt, Pd, Ag, Mg, Au, Ni, Nd, Ir, Cr, Li, Ca, Mo, Ti, W, and Cu and may have a single layer or multi-layer structure.

The capacitor Cst includes a lower electrode CE1 and an upper electrode CE2, which overlap each other with the first interlayer insulating layer 113 therebetween. The capacitor Cst may overlap the first transistor TFT1. In this regard, FIG. 11 illustrates that the gate electrode 134 of the first TFT TFT1 is the lower electrode CE1 of the capacitor Cst. In another embodiment, the capacitor Cst may not overlap the first TFT TFT1. The capacitor Cst may be covered with the second interlayer insulating layer 114.

A pixel circuit including the first TFT TFT1 and the capacitor Cst may be covered with the first insulating layer 115 and the second insulating layer 116. The first insulating layer 115 and the second insulating layer 116 may be planarization insulating layers and organic insulating layers. The first insulating layer 115 and the second insulating layer 116 may include an organic insulating material, for example, a general-purpose polymer such as polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, the first insulating layer 115 and the second insulating layer 116 may include polyimide.

The first insulating layer 115 and the second insulating layer 116 may be positioned in the display area DA and the peripheral area PA of the substrate 100 and may have a first opening OP1 in the peripheral area PA. The first insulating layer 115 and the second insulating layer 116 may be physically separated from each other into at least two parts based on the first opening OP1. This is to prevent impurities introduced from an outside, e.g., gas or moisture generated in the first insulating layer 115 and the second insulating layer 116 outside the first opening OP1, from reaching an inside of the display area DA via an inside of the first insulating layer 115 and the second insulating layer 116.

A display element, for example, an OLED 200 may be positioned on the second insulating layer 116. The OLED 200 may include a first electrode 211 as a pixel electrode, an intermediate layer 231, and a second electrode 251 as an opposite electrode.

The first electrode 211 of the OLED 200 may be positioned on the second insulating layer 116 and may be connected to the first TFT TFT1 via a connection electrode 181 on the first insulating layer 115. An input signal line 183, such as the data line DL and the power line PL, may be positioned on the first insulating layer 115.

The first electrode 211 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 211 may include a reflective layer including Ag, Mg, Al, Pt, Pd, Au, Ni, Nd, Ir, Cr, or a compound thereof. In another embodiment, the first electrode 211 may further include a layer formed of ITO, IZO, ZnO, or $In_2O_3$ on/under the above-described layer.

A third insulating layer 117 may be positioned on the second insulating layer 116 in the display area DA and the peripheral area PA. The third insulating layer 117 may have an opening corresponding to each of pixels in the display area DA, i.e., a second opening OP2 through which at least the center of the first electrode 211 is exposed, thereby defining a pixel. Also, the third insulating layer 117 may increase a distance between edges of the first electrode 211 and the second electrode 251, thereby preventing an arc from occurring in edges of the first electrode 211. The third insulating layer 117 may be formed of an organic material, such as polyimide (PI) or hexamethyldisiloxane (HMDSO).

The third insulating layer 117 may include a third opening OP3 through which the second conductive layer 160 is exposed in the first peripheral area PA1, a fourth opening OP4 through which the second conductive layer 160 in the first opening OP1 is exposed in the third peripheral area PA3, and a fifth opening OP5 through which the second conductive layer 160 is exposed in the second peripheral area PA2. Similar to the first opening OP1, the fourth opening OP4 may prevent impurities introduced from an outside, for example, gas or moisture generated in the third insulating layer 117 outside the first opening OP1 from reaching an inside of the display area DA via an inside of the third insulating layer 117. The second insulating layer 116 and the third insulating layer 117 may be formed of the same organic material. However, embodiments are not limited thereto. A width W2 of the fourth opening OP4 included in the third insulating layer 117 may be greater than a width W1 of the first opening OP1 included in the first and second insulating layers 115 and 116. Thus, the third insulating layer 117 may not be positioned in the first opening OP1.

The intermediate layer 231 includes an emission layer. The emission layer may include a polymer or small molecular weight organic material that emits light with a certain color. In an embodiment, the intermediate layer 231 may include a first functional layer under the emission layer and/or a second functional layer on the emission layer. The first functional layer and/or the second functional layer may include a layer integrally formed on the plurality of first electrodes 211 and may include a layer patterned to correspond to each of the plurality of first electrodes 211.

The first functional layer may have a single layer or multi-layer structure. For example, when the first functional layer includes a polymer material, the first functional layer that is a hole transport layer (HTL) having a single layer structure may include poly-(3,4)-ethylene-dihydroxy thiophene (PEDOT) or polyaniline (PAIN). When the first functional layer includes a small molecular weight material, the first functional layer may include a hole injection layer (HIL) and an HTL.

The second functional layer may not always be provided. For example, when the first functional layer and the emission layer include a polymer material, the second functional layer may be formed so that the OLED may perform optimally. The second functional layer may have a single layer or multi-layer structure. The second functional layer may include an electron transport layer (ETL) and/or an electron injection layer (EIL).

The second electrode 251 is positioned to face the first electrode 211 with the intermediate layer 231 therebetween. The second electrode 251 may include a conductive material having a small work function. For example, the second electrode 251 may include a (semi-)transparent layer including Ag, Mg, Al, Pt, Pd, Au, Ni, Nd, Ir, Cr, Li, Ca, or an alloy thereof. As another example, the second electrode 251 may further include a layer, such as ITO, IZO, ZnO, or $In_2O_3$, on the (semi-)transparent layer including the above-described materials.

The second electrode 251 may be positioned in the display area DA and the peripheral area PA and may be positioned on the intermediate layer 231 and the third insulating layer 117. The second electrode 251 may be integrally formed in multiple OLEDs 200 in the display area DA and thus may face multiple first electrodes 211. The second electrode 251 may be positioned inside the third and fourth openings OP3 and OP4 of the third insulating layer 117 in the peripheral area PA and may be in direct contact with the second conductive layer 160. The second electrode 251 may cover the first opening OP1 completely. That is, the second electrode 251 may cover all areas of the first opening OP1 completely. Thus, a path on which impurities, such as gas or moisture introduced from an area outside of the first opening OP1, which may be generated in an organic material, such as the third insulating layer 117, may be prevented from being penetrated into the display area DA. The second electrode 251 may be further positioned inside some of fifth openings OP5 of the third insulating layer 117 in the peripheral area PA.

A second TFT TFT2 may be positioned in the peripheral area PA of the substrate 100. The second TFT TFT2 may be positioned in the first peripheral area PA1 and/or the second peripheral area PA2. The second TFT TFT2 may be part of a circuit portion for controlling electrical signals applied into the display area DA, for example, a scan driver. The second TFT TFT2 may include a semiconductor layer 142, a gate electrode 144, a source electrode 146S, and a drain electrode 146D. The second TFT TFT2 may be formed by the same process as that of the first TFT TFT1. Thus, a detailed description of the second TFT TFT2 may be omitted.

A control signal line IW for applying a control signal to the circuit portion including the second TFT TFT2 may be positioned in the second peripheral area PA2. The control signal line IW may include signal lines that apply a clock signal, an inverted clock signal, a carry signal, etc. In FIG. 11, the control signal line IW is positioned on the same layer as a layer on which the source electrode 146S and the drain electrode 146D are positioned, on the second interlayer insulating layer 114. However, embodiments are not limited thereto. For example, the control signal line IW may be positioned on the same layer as a layer on which the semiconductor layer 142 or the gate electrode 144 is positioned, or may be positioned on the same layer as a layer on which the upper electrode CE2 of the capacitor Cst is positioned.

The second TFT TFT2 and the control signal line IW may be covered with the first insulating layer 115 and the second insulating layer 116. The first insulating layer 115 may include a first area 115a and a second area 115b, which are separated from each other based on the first opening OP1. The second insulating layer 116 may include a first area 116a and a second area 116b, which are separated from each other based on the first opening OP1.

A first conductive layer 150 may be positioned on a layer between the first insulating layer 115 and the second insulating layer 116. The first conductive layer 150 may be positioned on the same layer as a layer on which the connection electrode 181 and the input signal line 183 are positioned. The first conductive layer 150 may be physically separated from the first peripheral area PA1 and the second peripheral area PA2 based on the first opening OP1. The first conductive layer 150 may include first holes 150H1 and second holes 150H2 disposed adjacent to the periphery of the first opening OP1. The first conductive layer 150 may include first holes 150H1 in the first peripheral area PA1 and second holes 150H2 in the second peripheral area PA2.

A second conductive layer 160 may be positioned on the second insulating layer 116. The second conductive layer 160 may be positioned on the same layer as a layer on which the first electrode 211 of the OLED 200 is positioned. The second conductive layer 160 may be formed of the same material as a material for forming the first electrode 211 and may cover the first opening OP1 completely. The second conductive layer 160 may include third holes 160H1 and fourth holes 160H2 disposed adjacent to the periphery of the first opening OP1. The second conductive layer 160 may include the third holes 160H1 in the first peripheral area PA1 and the fourth holes 160H2 in the second peripheral area PA2.

In the first peripheral area PA1, the first holes 150H1 of the first conductive layer 150 and the third holes 160H1 of the second conductive layer 160 may overlap one another in the z-direction. The first holes 150H1 and the third holes 160H1 may function as paths on which gas generated from the first insulating layer 115 and the second insulating layer 116 arranged under the first conductive layer 150 and the second conductive layer 160, which may each include an organic material, is discharged to the outside. Thus, a deterioration of the quality of an image implemented with the display device 1 due to gas generated from the first insulating layer 115 and the second insulating layer 116 and penetrated into the display area DA may be prevented or reduced.

In the second peripheral area PA2, the second holes 150H2 of the first conductive layer 150 and the fourth holes 160H2 of the second conductive layer 160 may not overlap one another in the z-direction and may cross one another in the x-direction and the y-direction (on the plane). That is, in the second peripheral area PA2, the fourth holes 160H2 of the second conductive layer 160 may overlap a peripheral area of the first conductive layer 150 that is beyond the second holes 150H2 of the first conductive layer 150, and a peripheral area of the second conductive layer 160 that is beyond the fourth holes 160H2 of the second conductive layer 160 may overlap the second holes 150H2 of the first conductive layer 150.

In the above embodiment, there is provided an example arrangement disposes the first holes 150H1 and the third holes 160H1 to overlap, i.e., coincide with each other in the first peripheral area PA1 to face each other, such that the first holes 150H1 and the third holes 160H1 are aligned to register with each other, when viewed in a plan view or a cross-sectional view. However, in the second peripheral area, such an example arrangement disposes the second holes 150H2 and the fourth holes 160H2 to cross or not overlap, i.e., not coincide with each other, such that the second holes 150H2 and the fourth holes 160H2 are not registered with each other so as to be offset or spatially opposed to each other, both in their positioning and sequence in the x or y direction. Thus, when viewed in plan and cross-sectional views, the second holes 150H2 are spaced from the fourth holes 160H2 and alternate in positioning and sequence with the fourth holes 160H2.

Thus, the first conductive layer 150 or the second conductive layer 160 may be positioned on a layer between a conductive layer on the display panel 10 and the control signal line IW and may cover the control signal line IW so that signal interference between the conductive layer on the display panel 10 and the control signal line IW may be prevented. The conductive layer on the display panel 10 may be first and/or second sensing signal lines 450A and 450B of the input-sensing layer 40.

The first conductive layer 150 and the second conductive layer 160 may contact each other at the first contact part CNT1 and the second contact part CNT2 to be electrically connected to each other, as shown in FIG. 8. Edges of the first conductive layer 150 may be contact edges of the second conductive layer 160 at the third contact part CNT3. The first conductive layer 150 and the second conductive layer 160 may be in contact with a main power line PL' on the second interlayer insulating layer 114 at the third contact part CNT3. The main power line PL' may be a line in the peripheral area PA so as to provide a second power supply voltage ELVSS to each pixel P, as described above. That is, the first conductive layer 150 and the second conductive layer 160 may be a connection line for connecting the main power line PL' for supplying power to the second electrode 251 and the first electrode 211.

A third insulating layer 117 may be positioned on the second conductive layer 160. At least a portion of the second conductive layer 160 may be exposed through the third opening OP3, the fourth opening OP4, and the fifth opening OP5 of the third insulating layer 117. The second conductive layer 160 may be in contact with the second electrode 251 in the third opening OP3 and the fourth opening OP4 of the third insulating layer 117. The second conductive layer 160 may be in contact with the second electrode 251 in the fifth opening OP5.

An encapsulation layer 300 may be positioned on the second electrode 251 so that the display device 1 may be protected from external foreign substances or moisture. The encapsulation layer 300 may include at least one organic encapsulation layer and at least one inorganic encapsulation layer. FIGS. 13 and 14 illustrate that the encapsulation layer 300 includes first and second inorganic encapsulation layers 310 and 330 and an organic encapsulation layer 320 therebetween. In another embodiment, the number of organic encapsulation layers, the number of inorganic encapsulation layers and a stacking order thereof may be changed.

The first and second inorganic encapsulation layers 310 and 330 may include one or more inorganic insulating materials selected from the group consisting of aluminum oxide, titanium oxide, tantalum oxide, hafnium oxide, zinc oxide, silicon oxide, silicon nitride, and silicon oxynitride and may be formed by chemical vapor deposition (CVD). The organic encapsulation layer 320 may include polyethylene terephthalate, polyethylene naphthalate, polycarbonate, polyimide, polyethylene sulfonate, polyoxymethylene, polyarylate, HMDSO, an acryl-based resin, for example, polymethyl methacrylate, polyacrylic acid, or a certain combination.

The input-sensing layer 40 is positioned on the encapsulation layer 300. FIGS. 13 and 14 illustrate the sensing electrodes TSE (i.e., first sensing electrodes 410 or second sensing electrodes 420) positioned on the encapsulation layer 300 and sensing signal lines (i.e., first sensing signal lines 450A or second sensing signal lines 450B). The sensing electrodes TSE may be positioned in the display area DA, and the first sensing signal lines 450A and the second sensing signal lines 450B may be arranged in the peripheral area PA. At least a portion of the first sensing signal lines 450A and at least a portion of the second sensing signal lines 450B may overlap the control signal lines IW in the second peripheral area PA2. Due to crossing arrangement of hole patterns of the first conductive layer 150 and the second conductive layer 160, coupling between the first sensing signal lines 450A, the second sensing signal lines 450B and the control signal lines IW in the second peripheral area PA2 may be prevented.

Figure 15:
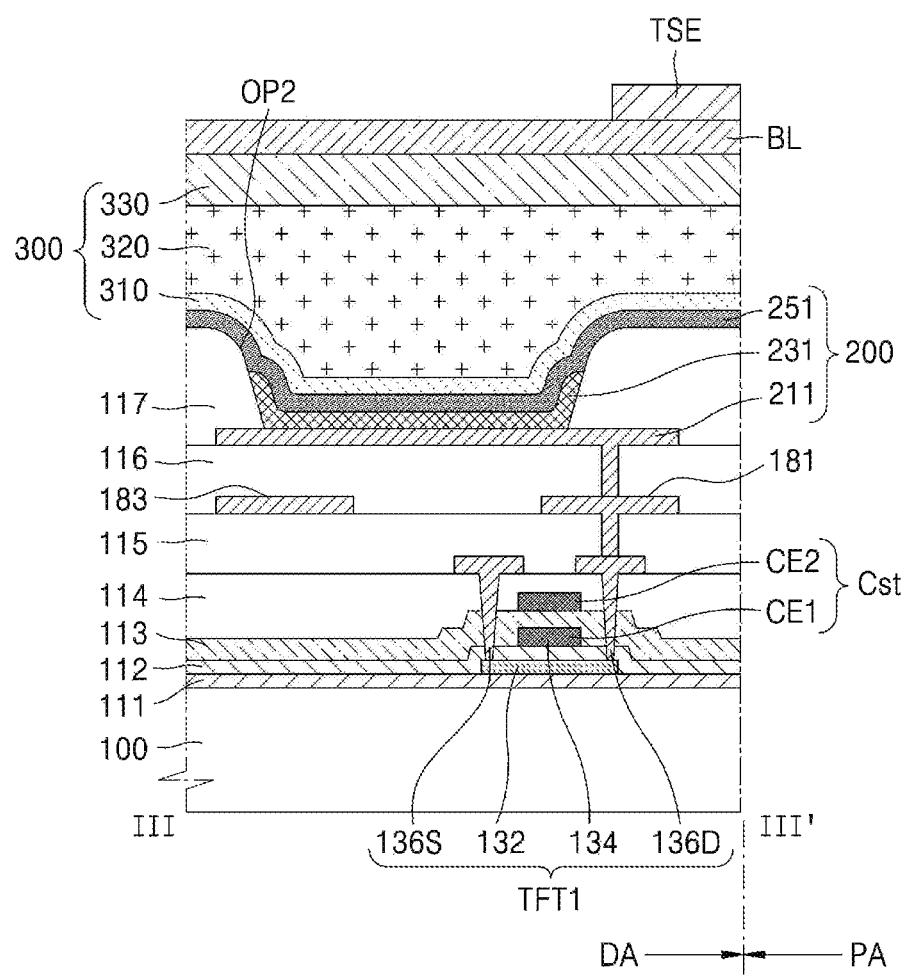
FIGS. 15 and 16 are sectional views schematically illustrating parts of the display area and the peripheral area taken along line and IV-IV' of FIG. 12 according to another embodiment.
Figure 16:
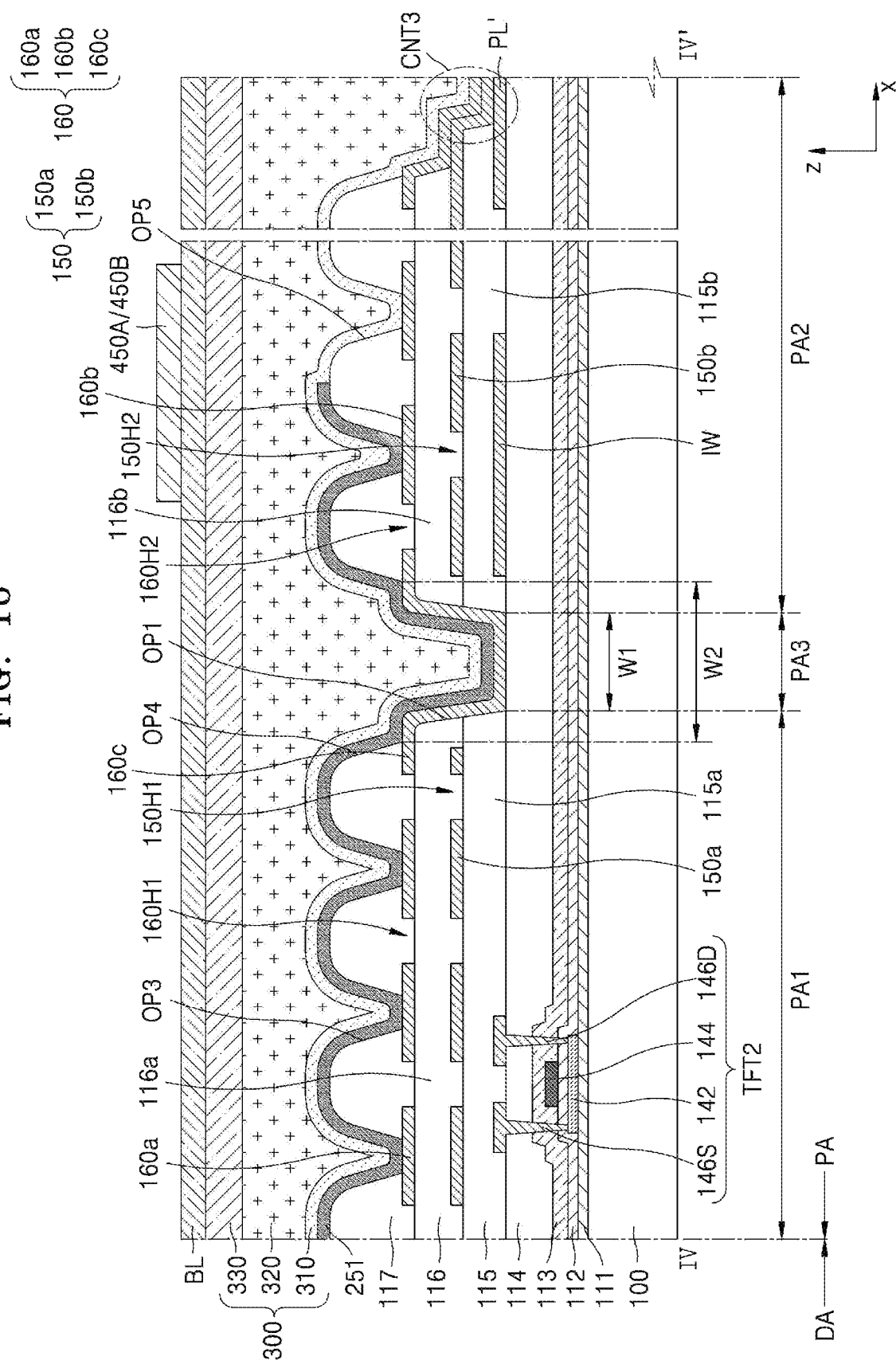

The embodiment of FIGS. 13 and 14 illustrates an example in which the base layer BL of the input-sensing layer 40 is the second inorganic encapsulation layer 330 positioned on the uppermost layer of the encapsulation layer 300. As another example shown in FIGS. 15 and 16, the base layer BL of the input-sensing layer 40 may be an insulation substrate or insulation film positioned on the encapsulation layer 300. In a display device which is unlike that which is discussed herein, impurities, such as gas or moisture introduced as a result of being generated in an organic material included in the display device, may be penetrated into a display element such that the quality of an image intended by an associated manufacturing process or associated use may be deteriorated. According to embodiments herein, however, such deterioration of the quality of an image may be prevented or reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:
1. A display device, comprising:
 a substrate comprising a display area and a peripheral area surrounding a periphery of the display area, the peripheral area comprising a first peripheral area and a second peripheral area;
 an insulating layer comprising a first insulating layer and a second insulating layer each disposed in the display area, the first peripheral area and the second peripheral area, and a first opening penetrating the first insulating layer and the second insulating layer between the first peripheral area and the second peripheral area;
 a first conductive layer comprising a first hole disposed in the first peripheral area and a second hole disposed in the second peripheral; and
 a second conductive layer disposed on the first conductive layer, and comprising a third hole disposed in the first peripheral area and a fourth hole disposed in the second peripheral area,
 wherein a portion of the first hole and a portion of the of the third hole layer overlap each other, and the second hole and the fourth hole are offset from one another.

2. The display device of claim 1, wherein the first conductive layer is disposed on the first insulating layer, and the second conductive layer is disposed on the second insulating layer.

3. The display device of claim 1, wherein the second conductive layer is disposed over the first opening.

4. The display device of claim 1, further comprising:
a first electrode disposed in the display area and on the second insulating layer;
an emission layer disposed on the first electrode; and
a second electrode facing the first electrode.

5. The display device of claim 4, further comprising:
a third insulating layer disposed on the second insulating layer, and comprising a second opening through which a portion of the first electrode is exposed and a third opening through which a portion of the second conductive layer is exposed.

6. The display device of claim 5, wherein the second electrode contacts the second conductive layer in the third opening.

7. The display device of claim 5, wherein the third insulating layer further comprises a fourth opening in which the first opening is disposed.

8. The display device of claim 4, wherein the second conductive layer and the first electrode are positioned on a same layer.

9. The display device of claim 4, wherein the second electrode is disposed over a portion of the second peripheral area.

10. The display device of claim 1, further comprising:
a contact part that contacts the first conductive layer and the second conductive layer.

11. The display device of claim 1, further comprising:
a first signal line disposed between the substrate and the first conductive layer in the second peripheral area; and
a second signal line disposed on the second conductive layer in the second peripheral area.

12. The display device of claim 11, wherein varying voltages are applied to the first signal line and the second signal line.

13. The display device of claim 11, further comprising:
an encapsulation layer disposed between the second signal line and the second conductive layer.

14. The display device of claim 11, further comprising:
a power line disposed in the second peripheral area and on a same layer as the first signal line, the power line contacting edges of the first conductive layer.

15. The display device of claim 1, further comprising:
a driving circuit disposed in the first peripheral area and under the first conductive layer.

16. The display device of claim 1, wherein the first hole and the third hole overlap to coincide and face each other.

17. The display device of claim 16, wherein the second hole and the fourth hole are offset to be spatially opposed in positioning and sequence.

18. A display device comprising:
a substrate comprising a display area and a peripheral area surrounding a periphery of the display area;
a first insulating layer disposed on the substrate;
a second insulating layer disposed on the first insulating layer, each of the first insulating layer and the second insulating layer being disposed in the display area and the peripheral area;
a first opening penetrating the first insulating area and the second insulating area in the peripheral area;
a first conductive layer disposed on the first insulating layer and having a first hole pattern; and
a second conductive layer disposed on the second insulating layer and having a second hole pattern,
wherein the first hole pattern and the second hole pattern coincide with each other in an area between the display area and the first opening, and
the first hole pattern and the second hole pattern cross each other in an area between the first opening and edges of the substrate.

19. The display device of claim 18, further comprising:
a first electrode disposed on the second insulating layer;
a third insulating layer disposed on the second insulating layer, and comprising a second opening through which a portion of the first electrode is exposed and a third opening through which a portion of the second conductive layer is exposed;
an emission layer disposed on the second opening; and
a second electrode facing the first electrode.

20. The display device of claim 19, wherein the second electrode contacts the second conductive layer in the third opening.

21. The display device of claim 19, wherein the second conductive layer and the first electrode are disposed on a same layer.

22. The display device of claim 19, further comprising:
a contact part that contacts the first conductive layer and the second conductive layer.

23. The display device of claim 18, wherein the first hole pattern and the second hole pattern coincide to face each other in the area between the display area and the first opening.

24. The display device of claim 23, wherein the first hole pattern and the second hole pattern cross each other to be spatially opposed in positioning and sequence in the area between the first opening and the edges of the substrate.

* * * * *